(12) United States Patent
Fujita et al.

(10) Patent No.: US 9,444,021 B2
(45) Date of Patent: Sep. 13, 2016

(54) FILM WIRING SUBSTRATE AND LIGHT EMITTING DEVICE

(71) Applicant: SHARP KABUSHIKI KAISHA, Osaka-shi, Osaka (JP)

(72) Inventors: Yuhsuke Fujita, Osaka (JP); Kenichi Akamatsu, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/406,710

(22) PCT Filed: May 10, 2013

(86) PCT No.: PCT/JP2013/003003
§ 371 (c)(1),
(2) Date: Dec. 9, 2014

(87) PCT Pub. No.: WO2013/186982
PCT Pub. Date: Dec. 19, 2013

(65) Prior Publication Data
US 2015/0162502 A1 Jun. 11, 2015

(30) Foreign Application Priority Data

Jun. 15, 2012 (JP) .................................. 2012-136436

(51) Int. Cl.
*H01J 1/02* (2006.01)
*H01L 33/48* (2010.01)
(Continued)

(52) U.S. Cl.
CPC ........... *H01L 33/486* (2013.01); *H01L 33/507* (2013.01); *H01L 33/52* (2013.01); *H01L 33/62* (2013.01); *H05K 1/0203* (2013.01); *H05K 1/0271* (2013.01); *H01L 2224/48091* (2013.01); *H01L 2924/3025* (2013.01); *H05K 1/09* (2013.01); *H05K 1/189* (2013.01); *H05K 2201/0355* (2013.01); *H05K 2201/09136* (2013.01); *H05K 2201/09845* (2013.01);
(Continued)

(58) Field of Classification Search
CPC combination set(s) only.
See application file for complete search history.

(56) References Cited

U.S. PATENT DOCUMENTS

2007/0052342 A1* 3/2007 Masuda ............. C09K 11/0883
  313/487
2013/0119426 A1 5/2013 Katoh et al.

FOREIGN PATENT DOCUMENTS

CN 1867223 A 11/2006
JP 63-213301 9/1988
(Continued)

OTHER PUBLICATIONS

Written Opinion of the International Searching Authority (English Translation), mailed Jun. 4, 2013.*
(Continued)

*Primary Examiner* — Thomas L Dickey
(74) *Attorney, Agent, or Firm* — Nixon & Vanderhye P.C.

(57) ABSTRACT

The folding along the disposed direction of wiring patterns is prevented. Concave-convex shapes in a plan view for preventing the folding of a device as step portions in a plan view are provided on opposing sides of two conductive regions. A front edge side 3a1 of a convex shape in a plan view of a Cu foil layer 3a, which is one of the two conductive regions, is disposed to enter into a concave portion (on the side of a bottom side 3b2) of a concave shape in a plan view of a Cu foil layer 3b, which is the other conductive region, to prevent the folding along the disposed direction of wiring patterns.

16 Claims, 13 Drawing Sheets

(51) Int. Cl.
*H01L 33/62* (2010.01)
*H01L 33/50* (2010.01)
*H01L 33/52* (2010.01)
*H05K 1/02* (2006.01)
*H05K 1/09* (2006.01)
*H05K 1/18* (2006.01)

(52) U.S. Cl.
CPC ............... *H05K2201/09854* (2013.01); *H05K 2201/10106* (2013.01); *H05K 2201/2009* (2013.01)

(56) References Cited

FOREIGN PATENT DOCUMENTS

| | | |
|---|---|---|
| JP | 5-25749 | 4/1993 |
| JP | 5-25749 U | 4/1993 |
| JP | 2003-023221 | 1/2003 |
| JP | 2005-136224 A | 5/2005 |
| JP | 2005-27216 A | 8/2005 |
| JP | 2005-217216 | 8/2005 |
| JP | 2006-324608 | 11/2006 |
| JP | 2006-324608 A | 11/2006 |
| JP | 2009-105198 | 5/2009 |
| JP | 2009-105198 A | 5/2009 |
| JP | 2012-33855 A | 2/2012 |
| WO | WO 2012/011363 | 1/2012 |

OTHER PUBLICATIONS

Taiwanese Office Action mailed Dec. 25, 2014 in TW application 1032805330.
Japanese Office Action and partial English translation mailed Jul. 2, 2015 in JP application 2014-520882.
International Search Report for PCT/JP2013/003003, mailed Jun. 4, 2013.

* cited by examiner

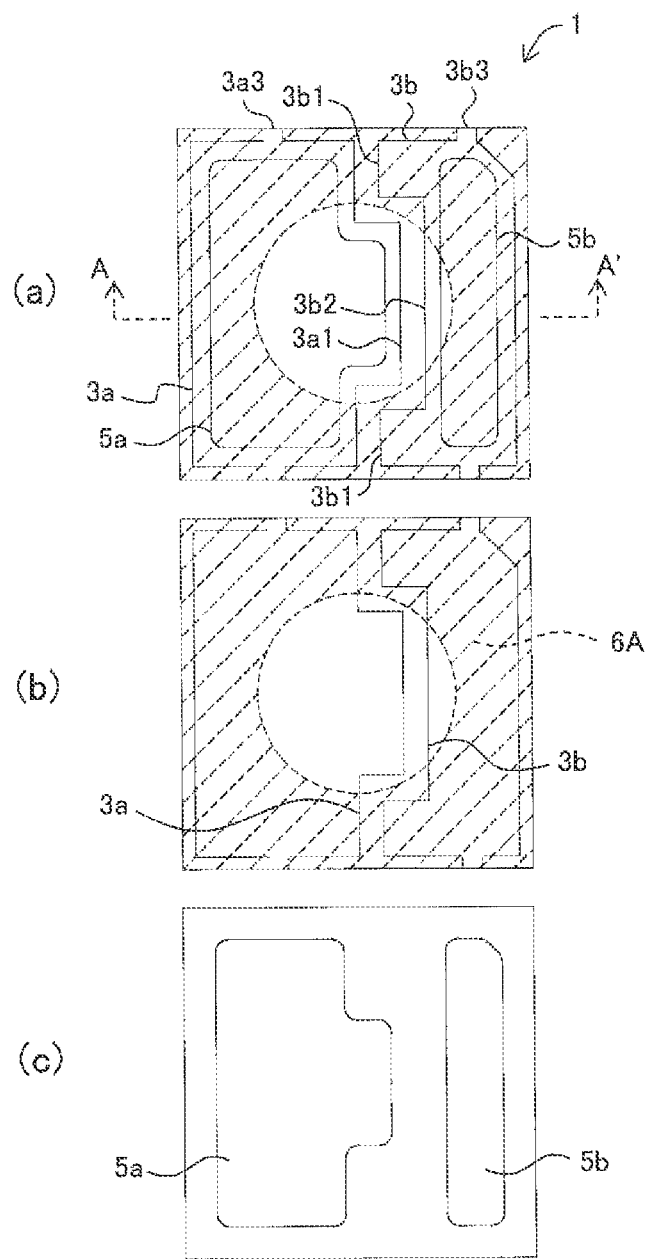

Fig.2C
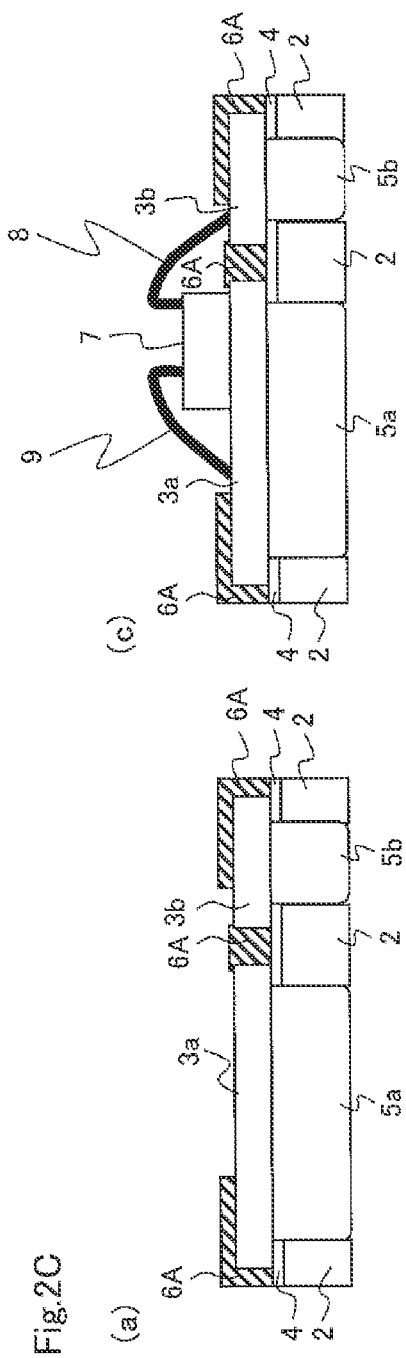
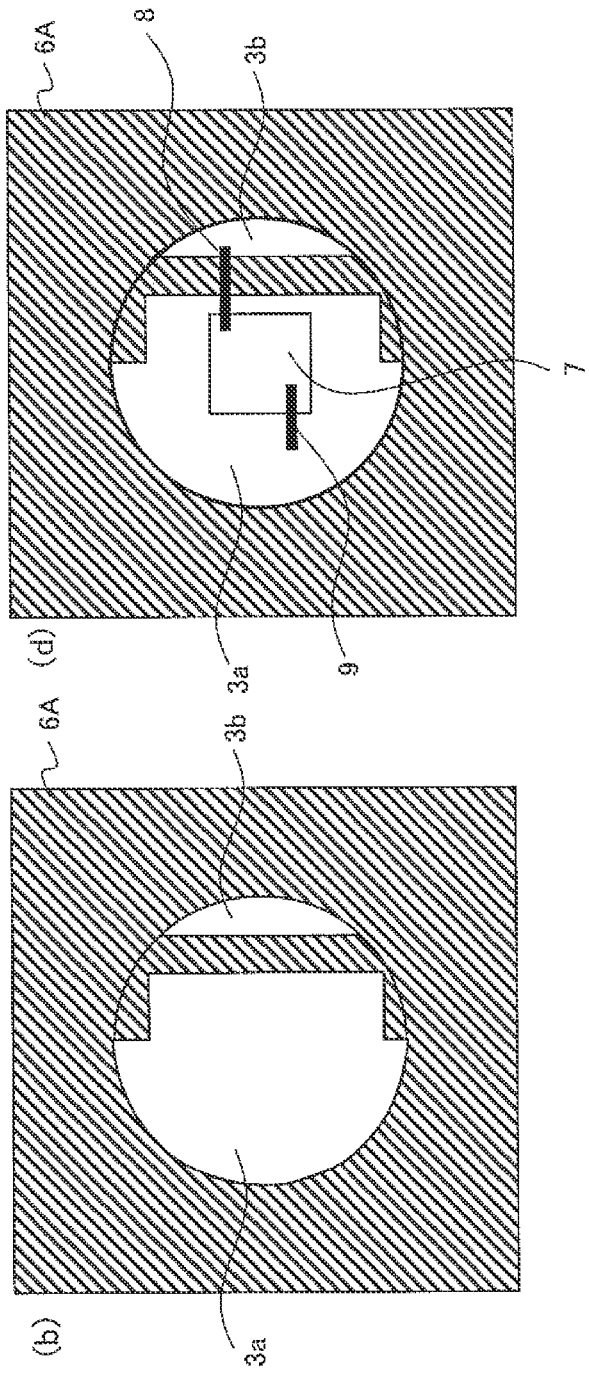

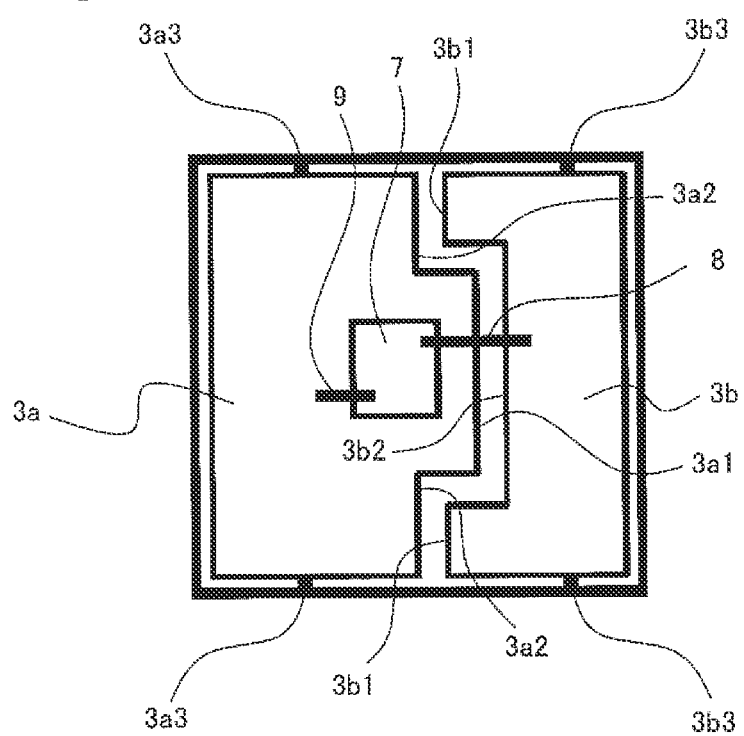

FILM WIRING SUBSTRATE AND LIGHT EMITTING DEVICE

This application is the U.S. national phase of International Application No. PCT/JP2013/003003, filed May 10, 2013, which designated the U.S. and claims priority to JP Application No. 2012-136436, filed Jun. 15, 2012, the entire contents of each of which are hereby incorporated by reference.

TECHNICAL FIELD

The present invention relates to a film wiring substrate used in, for example, an LED module and an LED package, and a light emitting device such as an LED device or a laser device using the same.

BACKGROUND ART

Conventionally, from the perspective of energy conservation, $CO_2$ emission reduction and the like, there are portable equipment using a liquid-crystal display represented by a portable telephone device and a lap top personal computer, a liquid-crystal TV called LED-TV using an LED back light, and a product using an LED chip as a light source such as an LED light bulb using an LED module as a light source.

LED modules or LED packages in which an LED chip is implemented in a wiring substrate such as a glass epoxy substrate, an aluminum based substrate and a ceramic substrate are incorporated in the aforementioned product. In addition to the above products, there is also a product that incorporates a white molding resin molded LED package in which an LED chip is implemented in a lead frame.

In general, a GaN-based blue LED chip is used as the LED chip used in these LED modules and LED packages. The LED chip has a mechanism such that the chip is sealed with a resin sealing material that is mixed with a fluorescent material capable of performing wavelength conversion of the blue light to white to emit white light.

FIG. 12 is a rear view showing a configuration example of a conventional wiring substrate disclosed in Patent Literature 1.

As shown in FIG. 12, the wiring pattern surface on the back surface side of a conventional wiring substrate 100 only has to secure a power supply wiring pattern 101, which is a wiring pattern with a cross-sectional area that is necessary for supplying power. Other patterns are directly connected to a heat dissipating metal filling portion of a via hole, and they are able to secure a large area as a heat dissipating wiring pattern 102 that is electrically insulated from the power supply wiring pattern 101.

FIG. 13 is a rear view showing another configuration example of the conventional wiring substrate disclosed in Patent Literature 1.

As shown in FIG. 13, the substrate is formed such that copper patterns 103 do not go across the outer shape portion that is pressed and cut with an edged tool of the conventional wiring substrate 100. Thus, the drop out of a metal burr or a burr of the wiring patterns 103 can be completely avoided, and the life span of the thin edged tool can be prolonged. Further, the top surface side thereof has metal filling portions 104 that are connected to the right and left wiring patterns 103, and an LED chip 105 that is connected to the center wiring pattern 103.

FIG. 14 is a plan view showing yet another configuration example of a conventional film wiring substrate.

As shown in FIG. 14, in a conventional thin and soft film wiring substrate 200 used in LEDs, a left copper pattern 202, which is equipped with a light emitting element 201, and a right copper pattern 203, which is not equipped with the light emitting element 201, are disposed to oppose each other in parallel spaced by a prescribed interval.

Patent Literature 2 discloses that a film wiring substrate is equipped with an LED element. That is, Patent Literature 2 comprises a flexible wiring substrate in which: a circuit wiring is formed on a flexible substrate; another flexible substrate is formed thereon with an adhesive interposed therebetween; and a flexible reflecting layer that reflects light from a dice of a light emitting diode is formed thereon.

CITATION LIST

Patent Literature

Patent Literature 1: Japanese Laid-Open Publication No. 2012-33855
Patent Literature 2: Japanese Laid-Open Publication No. 2005-136224

SUMMARY OF INVENTION

Technical Problem

In the conventional wiring substrate disclosed in Patent Literature 1, the power supply wiring pattern 101 and the heat dissipating wiring pattern 102 are shaped such that they go into each other, as shown in FIG. 12. However, the heat dissipating wiring pattern 102 is placed on substantially the whole surface, and thus the substrate is not configured in the way that only the wiring pattern having different polarity is disposed to oppose each other separately on both sides.

In the conventional wiring substrate disclosed in Patent Literature 1, three wiring patterns 103 in the center and in the right and left on the back surface side are disposed to oppose each other in parallel spaced by a predetermined interval, as shown in FIG. 13. Thus, the substrate easily folds in the disposed direction of the wiring patterns 103.

In addition, in the above-described conventional thin and soft film wiring substrate 200 shown in FIG. 14, the left copper pattern 202 and the right copper pattern 203 are separated in an island-state, and are parallel to each other. Thus, there is a problem that the substrate easily folds between the wiring patterns 202 and 203.

In Patent Literature 2, there is no description concerning the prevention or suppression of the folding of the flexible wiring substrate disclosed in Patent Literature 2.

The present invention solves the above-described conventional problem. The objective of the present invention is to provide a film wiring substrate that is able to prevent or suppress the folding of a thin and soft film wiring substrate along the disposed direction of wiring patterns, and a light emitting device such as an LED device or a laser device using the same.

Solution to Problem

A film wiring substrate according to the present invention is configured such that two conductive regions corresponding to ± polarity are provided on a film base material, and the two conductive regions are spaced and insulated from each other while step portions in a plan view are provided on opposing sides of the two conductive regions, thereby achieving the objective described above.

Preferably, in the film wiring substrate according to the present invention, the step portions have at least either concave-convex shapes in a plan view for preventing the folding of a device or L-/L-shapes in a plan view for preventing the folding of a device.

Still preferably, in the film wiring substrate according to the present invention, the concave-convex shapes in a plan view are configured such that opposing sides of the two conductive regions fit into each other spaced by a predetermined distance.

Still preferably, in the film wiring substrate according to the present invention, a front edge side of a convex shape in a plan view of one of the two conductive regions is disposed to enter into a concave portion of a concave shape in a plan view of the other conductive region.

Still preferably, in the film wiring substrate according to the present invention, when a straight line is drawn along the side between two front edge sides of the concave portion in the concave shape in a plan view of the other conductive region, the front edge side of the convex shape in a plan view of the one of the conductive regions is on the straight line or is within the concave portion past the straight line.

Still preferably, in the film wiring substrate according to the present invention, at least one of the front edge sides on both sides of the concave portion of the concave-convex shapes in a plan view is extended up to a power supply portion on the side of the convex shape of an adjacent device.

Still preferably, in the film wiring substrate according to the present invention, at least one of the front edge sides on both sides of the concave portion of the concave-convex shapes in a plan view is extended up to an opposite side edge portion on the side of the convex shape.

Still preferably, in the film wiring substrate according to the present invention, each of the two conductive regions is at least a Cu foil layer of the Cu foil layer and a Cu post electrically connected directly under thereto.

Still preferably, in the film wiring substrate according to the present invention, each Cu foil layer of the two conductive regions is provided on the film base material with an adhesion layer interposed therebetween, and the Cu post is embedded in through holes of the film base material directly under each of the Cu foil layers.

Still preferably, in the film wiring substrate according to the present invention, the concave-convex shapes in a plan view exist singularly or in plural numbers.

Still preferably, in the film wiring substrate according to the present invention, the L-/L-shapes in a plan view is configured such that opposing sides of the two conductive regions go into each other spaced by a predetermined distance.

Still preferably, in the film wiring substrate according to the present invention, a high edge side of one of the L-shapes in a plan view is positioned to enter into the side of a low edge side of the other L-shape in a plan view, and a high edge side of the other L-shape in a plan view is positioned to enter into the side of a low edge side of the one of the L-shapes in a plan view.

Still preferably, in the film wiring substrate according to the present invention, when a straight line is drawn along a high edge side of the one of the L-shapes in a plan view, a high edge side of the L-shape in a plan view of the other conductive region is on the straight line or is within the side of a low edge side of the one of the L-shapes in a plan view past the straight line.

Still preferably, in the film wiring substrate according to the present invention, a high edge side of one of the L-shapes in a plan view of the two conductive regions is extended up to a power supply portion on the side of the other conductive region of an adjacent device.

Still preferably, in the film wiring substrate according to the present invention, a high edge side of one of the L-shapes in a plan view of the two conductive regions is extended up to an opposite side edge portion of the other conductive region.

Still preferably, in the film wiring substrate according to the present invention, a plurality of the two conductive regions are allocated in a matrix state for each light emitting device.

Still preferably, in the film wiring substrate according to the present invention, a white resist for light reflection is formed on the top surface portion on which the two conductive regions are not formed and a portion of the top surface portion of the two conductive regions.

A light emitting device according to the present invention is equipped with a light emitting element on either of the two conductive regions of the above-described film wiring substrate according to the present invention, and sealing with resin including at least a fluorescent material is performed while both electrodes of the light emitting element and the two conductive regions are electrically connected, thereby achieving the objective described above.

Hereinafter, functions of the present invention will be described by the above-described configurations.

In the present invention, two conductive regions corresponding to t polarity on a film base material are spaced and insulated from each other, while the opposing sides of the two conductive regions are provided with step portions in a plan view.

Thus, since the opposing sides of the two conductive regions have step portions in a plan view, it is possible to prevent or suppress the folding between wiring patterns in a thin and soft film wiring substrate.

Moreover, a white resist for light reflection is formed on the top surface part on which the two conductive regions are not formed, and a portion of the top surface of the two conductive regions. Thus, a folding prevention effect is exerted by filling the space between the two conductive regions and a portion of the top surface of the two conductive regions with the white resist for light reflection.

Advantageous Effects of Invention

According to the present invention as described above, since the opposing sides of the two conductive regions are provided with step portions in a plan view, it is possible to prevent or suppress the folding of a thin and soft film wiring substrate along the disposed direction of wiring patterns.

BRIEF DESCRIPTION OF THE DRAWINGS

FIG. 1(a) is a plan view showing a unit configuration example of a TAB substrate in Embodiment 1 of the present invention. FIG. 1(b) is a top surface view thereof, and FIG. 1(a) is a rear view thereof.

FIG. 2C is a longitudinal sectional view along the AA' line and a plan view of FIG. 1(a) when the portion other than an LED element equipped region and a region electrically connecting the LED element and the two conductive regions are covered with a white resist.

FIG. 3 is a plan view for explaining an element equipping step of an LED element.

Figure 2A:
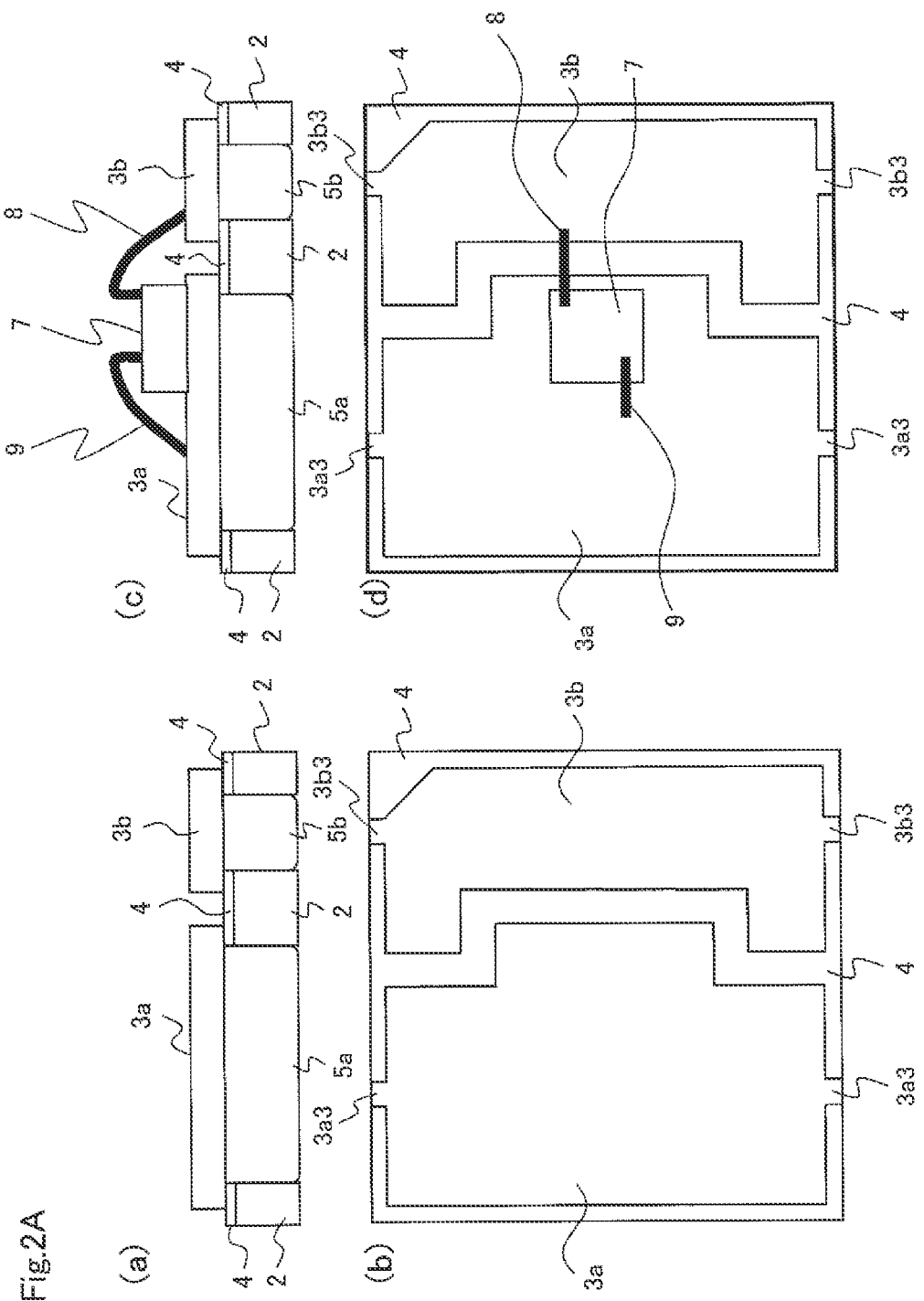
FIG. 2A is a longitudinal sectional view along the AA' line and a plan view of FIG. 1(a) when a white resist is not provided.

REFERENCE SIGNS LIST 1, 1A, 21, 31 TAB substrate (film wiring substrate)
1a three through holes of the TAB substrate 1
2 film base material
3a, 3b, 23a, 23b, 33a, 33b Cu foil layer
3b1 front edge side (high edge side) of the Cu foil layer 3b
3a1 front edge side (high edge side) of the Cu foil layer 3a
3b2 bottom side (low side) within a concave portion
3a3, 3b3 power supply portion
4 adhesion layer
5a, 5b, 25a, 25b, 35a, 35b Cu post
6, 6A white resist (the broken line portion 6A in FIG. 1)
7, 27, 37 LED element
8, 9, 27a, 27b, 37a, 37b wire
10 manufacturing stage
11 pin member
12 slightly adhesive material
13 reinforcing plate 13a through hole
13A slightly adhesive tape
14 lens
15 blade edge
20 TAB substrate (film wiring substrate)
23a1, 23b1, 33a1, 33b1 high edge side
23a2, 23b2, 33a2, 33b2 low edge side
28, 38 protection element

DESCRIPTION OF EMBODIMENTS

Hereinafter, Embodiments 1 and 2 of a film wiring substrate and a light emitting device using the same will be explained in detail while referring to the drawings. In addition, from the standpoint of creating the Figures, the thickness, length, and the like of each constituent member in each Figure is not limited to the illustrated configuration.

Embodiment 1

Figure 2B:
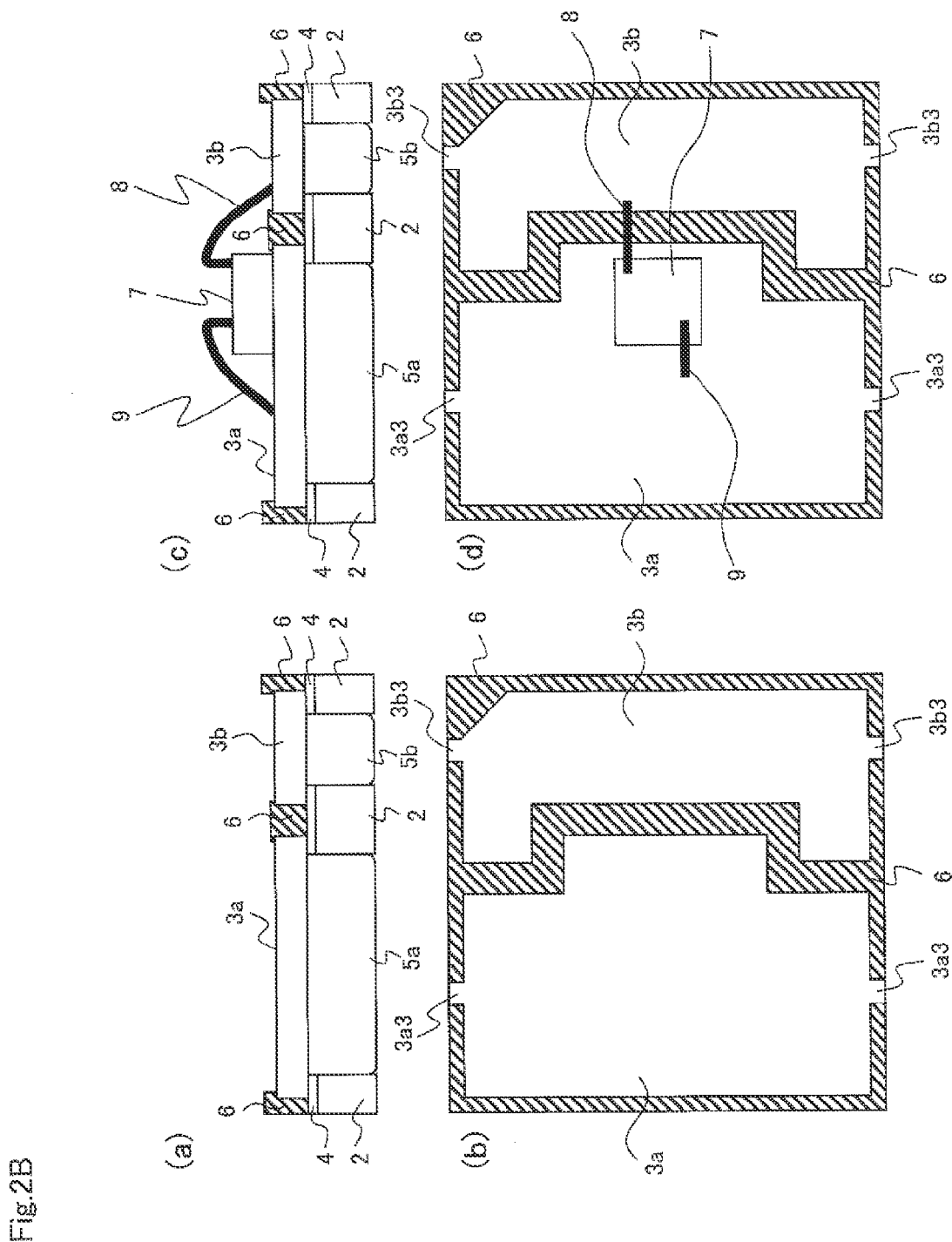
FIG. 2B is a longitudinal sectional view along the AA' line and a plan view of FIG. 1(a) when a white resist is provided only on an adhesion layer of a film base material.

FIG. 1(a) is a plan view showing a unit configuration example of a TAB substrate in Embodiment 1 of the present invention. FIG. 1(b) is a top surface view thereof, and FIG. 1(c) is a rear view thereof. FIG. 2A is a longitudinal sectional view along the AA' line and a plan view of FIG. 1(a) when a white resist is not provided. FIG. 2B is a longitudinal sectional view along the AA' line and a plan view of FIG. 1(a) when a white resist is provided only on an adhesion layer on a film base material. FIG. 2C is a longitudinal sectional view along the AA' line and a plan view of FIG. 1(a) when the portion other than an LED element equipped region and a region electrically connecting the LED element and two conductive regions are covered with a white resist. FIG. 1(a) is a plan view thereof, however, a top surface view and a rear view are also included. Further, in addition to the provision of step portions in a plan view (concave-convex portions in a plan view for the prevention of folding of a device) on the opposing sides of two conductive regions as in FIG. 2A, by filling the space between the two conductive regions with a white resist 6 for light reflection as in FIG. 2B and FIG. 2C, folding is further prevented. Furthermore, the space between the two conductive regions is filled with a white resist, which has a higher reflectivity than a film substrate, resulting in improved light extraction efficiency. In FIG. 2C, the white resist 6 for light reflection is applied to each electrode region other than an LED element 7 equipped region and a region electrically connecting the region of the LED element 7 to the two conductive regions on at least the top surface region of Cu foil layers 3a and 3b, and a region on an adhesion layer on a film base material.

The white resist 6 protrudes over the top surface side of the Cu foil layer. The difference between (a) and (b), and (c) and (d) in FIG. 2A to FIG. 2C is that (c) and (d) in FIG. 2A to FIG. 2C are equipped with the LED element 7 as a semiconductor chip.

In FIG. 1(a) to FIG. 1(c) and FIG. 2A to FIG. 2C, a TAB (tape-automated bonding) substrate 1 as a film wiring substrate (flexible substrate) of Embodiment 1 of the present invention is configured such that Cu foil layers 3a and 3b in predetermined shapes constituting two conductive regions corresponding to ±polarity are provided on a film base material 2 consisting of a thin and soft polyimide material with an adhesion layer 4 interposed therebetween. Cu posts 5a and 5b functioning as a heat sink are embedded in through holes of the film base material 2. The Cu posts 5a and 5b are electrically connected directly under the Cu foil layers 3a and 3b, respectively. In the top surface of the TAB substrate 1, the white resist 6 or 6A for light reflection is provided on a region other than an LED element 7 equipped region and a region electrically connecting each electrode region of the LED element 7 and the two conductive regions on the top surface region of the Cu foil layers 3a and 3b, and a region on the adhesion layer 4 (adhesive layer) on the film base material 2.

Each of the Cu foil layers 3a and 3b, which are left and right electrode regions, is connected by wires 9 and 8, respectively, from each electrode region of the LED element 7, as shown in FIG. 3. The LED element 7 is equipped on the Cu foil layer 3a, and the LED element 7 itself is fixed with die bond. Further, each of the wires 8 and 9 from each electrode of the LED element 7 is bonded to the Cu foil layers 3a and 3B as left and right electrode regions, respectively.

The LED element 7 is equipped on the thin and soft TAB substrate 1, as shown in FIG. 3. However, there is a need to prevent the folding of the TAB substrate 1 in the middle of a device.

(Concave-Convex Shapes in a Plan View for Prevention of Folding of Device)

In the TAB substrate 1, the Cu foil layers 3a and 3b, which are conductive layers, are insulated from each other. However, in order to prevent folding or cracking, the patterns thereof in a plan view are formed such that they fit into each other in at least surface concave-convex shapes.

In this case, the distance between the Cu foil layers 3a and 3b is about 0.2 mm. In short, the front edge side of the convex-shaped Cu foil layer 3a in a plan view is positioned to enter into the concave portion of the concave-shaped Cu foil layer 3b in a plan view. In this case, the Cu foil layer 3a in a convex shape and the Cu foil layer 3b in a concave shape is one portion each, and the convex shape and the concave shape can be disposed in a plurality of portions to fit into each other. In this case, the Cu foil layer 3a in a convex shape and the Cu foil layer 3b in a concave shape preferably enter and fit into each other in a deeper level. In order to obtain some effects of preventing the folding of a device, at least the front edge side 3a1 of the Cu foil layer 3a in the convex portion is required to be positioned closer to the side of the bottom side 3b2 of the Cu foil layer 3b than the position between the front edge sides 3b1 of the Cu foil layer 3b in the concave portion, as shown in FIG. 1(*a*). In short, when a straight line is drawn along the front edge sides 3b1 of the Cu foil layer 3b in the concave portion, the convex portion's front edge side, the front edge side 3a1 is positioned on the side of the bottom side 3b2 of the Cu foil layer 3b in the concave portion past the straight line, and is at least within the concave portion.

If the Embodiment 1 has depth of the concavity of the Cu foil layer 3b in the concave portion as 0.4 mm, the height of the protrusion of the Cu foil layer 3a in the convex portion as 0.4 mm, and the distance between the Cu foil layers 3a and 3b as 0.2 mm, and a straight line is drawn along the front edge sides 3b1 of the Cu foil layer 3b in the concave portion, the front edge side 3a1 enters into the concave portion by 0.2 mm. In short, the front edge side 3a1 of the Cu foil layer 3a in the convex portion and the front edge sides 3b1 of the Cu foil layer 3b in the concave portion at least would not align as a straight line, and the front edge side 3a1 enters into the concave portion. Further, since the space between the opposing sides is meandering, a case in which the front edge side 3a1 is positioned on a straight line drawn along the front edge sides 3b1 of the Cu foil layer 3b in the concave portion is also effective in prevention or suppression of the folding of a device.

In addition, regarding the allowed length of extension of each front edge side 3b1 on the both sides of the Cu foil layer 3b in the concave portion, electrolytic plating is applied to the top surface of the Cu foil layers 3a and 3b. Thus, upper and lower devices are provided with power supply portions 3a3 and 3b3. Accordingly, each front edge side 3b1 on the both sides of the Cu foil layer 3b in the concave portion can be extended up to the power supply portion 3a3 at a maximum. If non-electrolytic plating is applied to the top surface of the Cu foil layers 3a and 3b, or electrolytic plating is not applied, each front edge side 3b1 in the both sides of the Cu foil layer 3b in the concave portion can be extended to the opposite side edge portion of the Cu foil layer 3a in the convex portion.

In addition, the space between the two conductive regions is filled with a white resist for light reflection resulting in some effects on prevention or suppression of the folding of a device.

Figure 4:
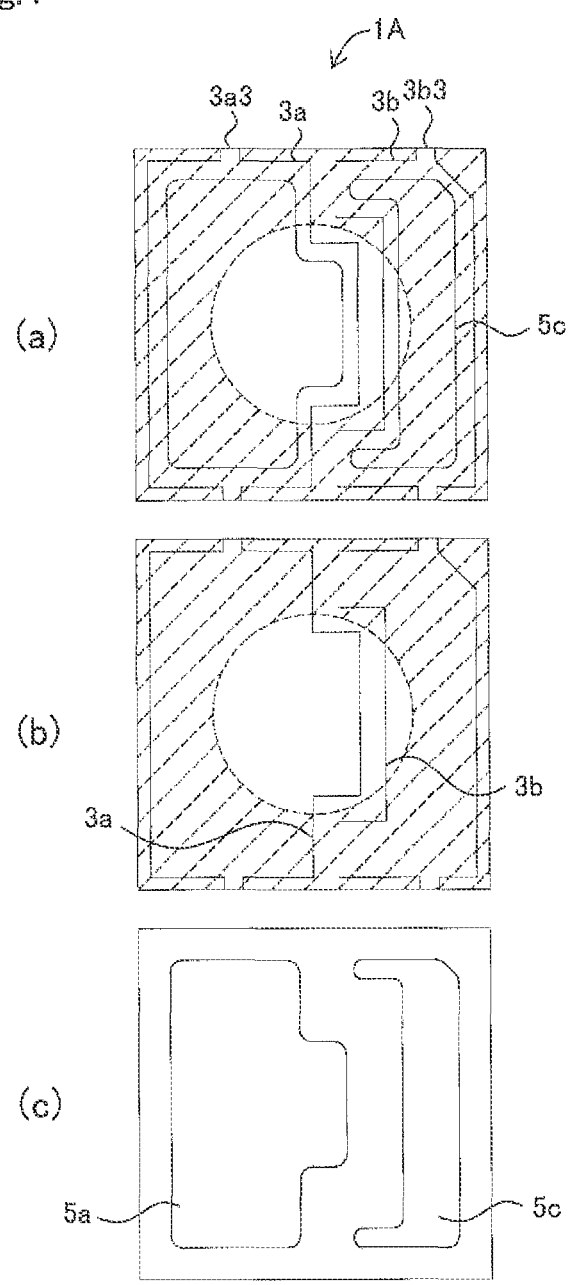
FIG. 4(a) is a plan view showing another unit configuration example of a. TAB substrate in Embodiment 1 of the present invention.
FIG. 4(b) is a top surface view thereof.
FIG. 4(c) is a rear view thereof.

A case in which the Cu foil layers 3a and 3b are formed such that they fit into each other in at least surface concave-convex shapes is described above. However, if the Cu posts 5a and 5b are formed such that they fit into each other in at least surface concave-convex shapes instead of such formation, or in addition to such formation, the folding or cracking of the device can be prevented. In short, the front edge side of the convex-shaped Cu post 5a in a plan view is positioned to enter into the concave portion of the concave-shaped Cu post 5b in a plan view. In FIG. 4(*a*) to FIG. 4(*c*), the Cu post 5b in FIG. 1(*c*) is replaced with a Cu post 5c in which the both end sides extend toward the Cu post 5a. Compared to the Cu post 5b, the Cu post 5c is effective in the prevention of the folding of a device since the space between the opposing sides is meandering.

Figure 5:
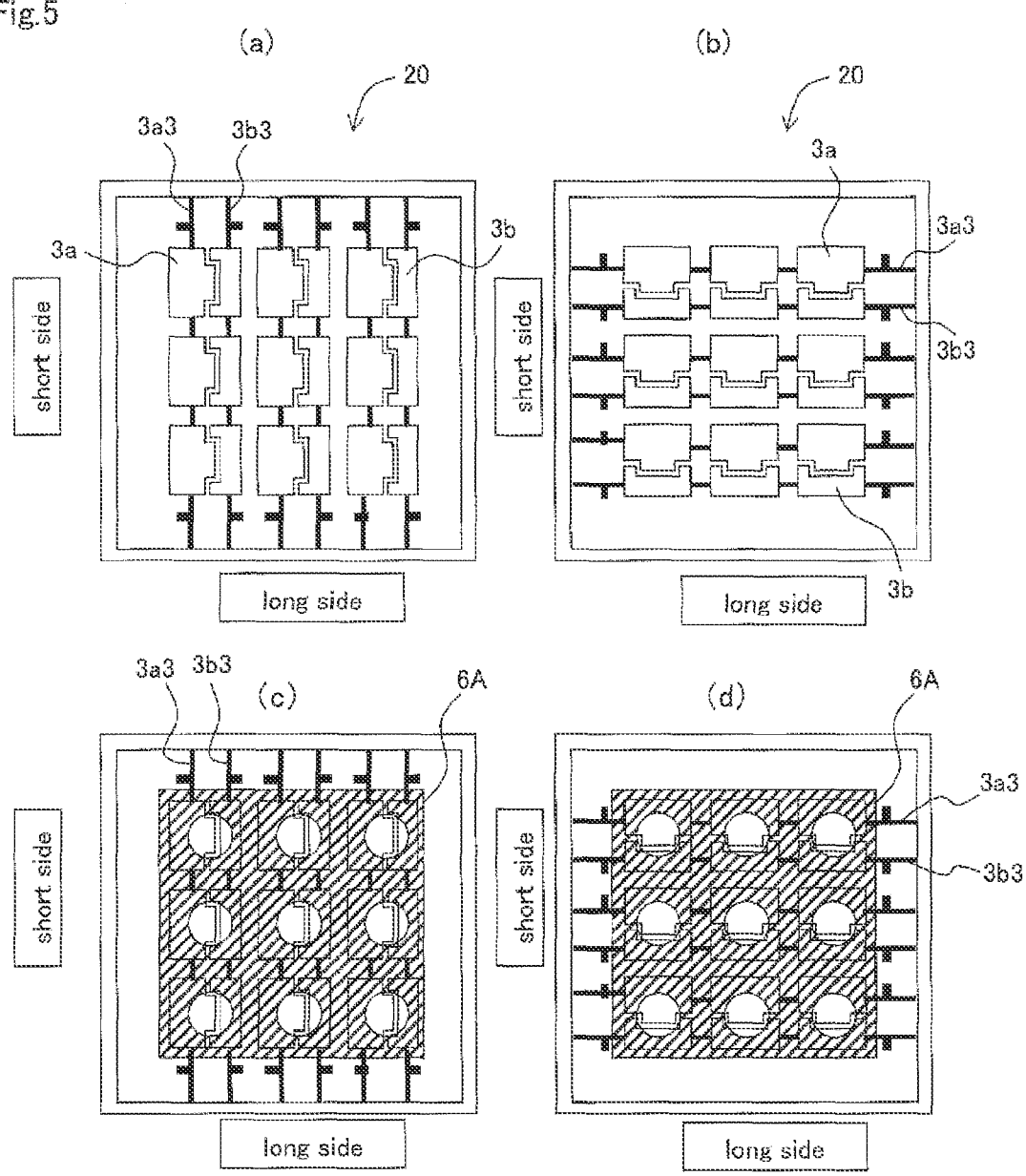
FIGS. 5(a) to (d) are plan views of a film wiring substrate (flexible substrate) in which a plurality of TAB substrates are disposed in a matrix state.

Further, FIG. 5(*a*) to FIG. 5(*d*) are plan views showing a film wiring substrate (flexible substrate) on which a plurality of TAB substrates 1 are disposed in a matrix state.

As shown in FIG. 5(*a*) to FIG. 5(*d*), a TAB substrate 20 is a film wiring substrate (flexible substrate) on which a plurality of TAB substrates 1 such as a plurality of LED devices are disposed in a matrix state in two dimensions. A plurality of Cu foil layers 3a and 3b are connected in the short side direction of FIG. 5(*a*) or the long side direction of FIG. 5(*b*), respectively, by the power supply portions 3a3 and 3b3. A configuration of either FIG. 5(*a*) or FIG. 5(*b*) may be used. In addition, a configuration of either FIG. 5(*c*) or FIG. 5(*d*) in which the white resist 6A (shaded area) is provided thereon may be used.

The Cu posts 5a and 5b are electrically connected to the Cu foil layers 3a and 3b, respectively. In the top surface of the TAB substrate 1, the white resist 6 or 6A for light reflection is provided on a region other than an LED element 7 equipped region and a region electrically connecting each electrode region of the LED element 7 and two conductive regions in the top surface region of the Cu foil layers 3a and 3b, and a region on the adhesion layer 4 (adhesive layer) on the film base material 2.

(Tack Sheet to which Slightly Adhesive Material is Applied)

Figure 6:
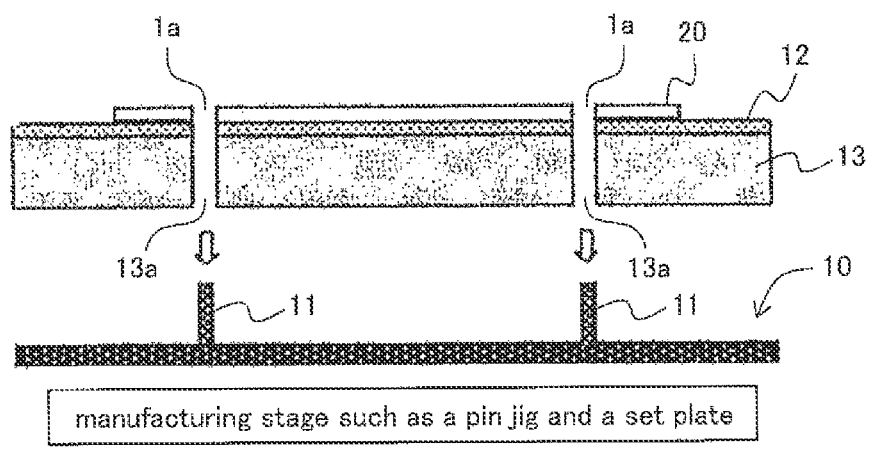
FIG. 6 is a schematic longitudinal sectional view for explaining a method of positioning a reinforcing plate (tack sheet) together with a TAB substrate 20.

FIG. 6 is a schematic longitudinal sectional view for explaining a method of positioning a reinforcing plate (tack sheet) together with a TAB substrate 20.

In FIG. 6, there is provided a manufacturing stage 10 such as a pin jig and a set plate, where a plurality of pin members 11 provided with a tapered tip (not tapered herein) are set up. The pin members 11 of the manufacturing stage 10 correspond to through holes 13a of a reinforcing plate 13 to which a slightly adhesive material 12 is applied. The pin members 11 are inserted into the through holes 13a of the reinforcing plate 13 to adjust the positions of the manufacturing stage 10 and the reinforcing plate 13. The number of pin members 11 may be any plural numbers. The multiple corresponding through holes 13a and 1a that are provided on the reinforcing plate 13 and the TAB substrate 20 are provided at the same positions. The through holes 1a of the TAB substrate 20 are provided at an outer peripheral edge part out of the product area.

The through holes 1a of the TAB substrate 20 match the positions corresponding to the through holes 13a of the reinforcing plate 13. The pin members 11 that are protruded from the through holes 13a of the reinforcing plate 13 are passed through the through holes 1a of the TAB substrate 20, and then the back surface of the TAB substrate 20 is pressed against and stuck to the slightly adhesive material 12 on the reinforcing plate 13 such that the surface becomes flat.

The slightly adhesive material 12 is constituted with silicon, fluoro rubber, acryl, urethane, or the combination thereof. The thickness thereof is about 0.05 mm to 0.3 mm. If the thickness of the slightly adhesive material 12 is greater than 0.3 mm, ultrasonic waves would be absorbed at the time of wire bonding, and thus the bonding becomes difficult. If the thickness of the slightly adhesive material 12 is less than 0.05 mm, the adhesive force would be too small and the sticking of the TAB substrate 20 becomes difficult. More preferably, the thickness of the slightly adhesive material 12 is about 0.05 mm to 0.2 mm. A slightly adhesive material having heat-proof temperature of 150 degree Celsius to 300 degree Celsius is used as the slightly adhesive material 12. In the Embodiment 1, the heat-proof temperature needs to withstand 180 degree Celsius.

The reinforcing plate 13 is constituted with aluminum, stainless steel, heat-proof resin or the like, and the thickness thereof is about 0.1 mm to 0.6 mm. The thickness of the TAB substrate 20 is about 0.05 to 0.2 mm. The thickness of the TAB substrate 20 is set in consideration of a thickness of a conventional ceramic substrate.

Conventionally, a hard ceramic substrate material had been used. In order to effectively use a manufacturing line that used a ceramic substrate, the slightly adhesive material 12 is applied on the reinforcing plate 13 that is, for example, made of metal, and the back surface side of the TAB substrate 20 is stuck on the reinforcing plate 13. The TAB substrate 20 would have the same thickness and rigidity as those of a conventional ceramic substrate to facilitate the handling in each step.

In a sheet of TAB substrate 20, a plurality of LED devices are disposed in a matrix state in two dimensions. Such a TAB substrate 20 alone would warp. However, the TAB substrate 20 is stuck in a complete flat manner by the slightly adhesive material 12 on a sheet of metallic reinforcing plate 13. The warp of the TAB substrate 20 alone becomes different in accordance with the shape of the Cu posts 5a and 5b and the white resist 6. However, the warp is such that the gap between the central part and the edge part is about 1 mm. In the Embodiment 1, the central part of the TAB substrate 20 tends to swell and warp. At the time of sticking of the TAB substrate 20, the TAB substrate 20 is stuck in a complete flat manner to get rid of air between the TAB substrate 20 and the slightly adhesive material 12 on the reinforcing material 13.

By fixing the whole back surface of the TAB substrate 20 to the metallic flat reinforcing plate 13 with the slightly adhesive material 12, various processing can be performed on the TAB substrate 20 in a flat state without any warp throughout each step. Thus, abnormality in processing and defects in processing can be reduced.

A slightly adhesive material 12 that has enough adhesive force to stick the TAB substrate 20, but can be easily peeled off when attempting to peel off the TAB substrate 20, is used as a slightly adhesive material. The range of the adhesive force thereof is 0.1-5.0N/2.5 cm.

In addition, the slightly adhesive material 12 can be repeatedly used by restoring the adhesive force of the surface thereof by washing. Further, the adhesive force of the slightly adhesive material 12 does not greatly change after heat curing, and thus working efficiency can be improved by enabling the soft TAB substrate 20 to be easily peeled off. Thus, since the slight adhesive force of the slightly adhesive material 12 has heat-proof property as well as durability, and the slightly adhesive material 12 can be repeatedly used by restoring the adhesive force by washing the adhesive surface as described above, running cost can be reduced.

Hereinafter, the operations thereof will be described by the above-described configurations.

The pin members 11 of the manufacturing stage 10 are inserted into the through holes 13a of the reinforcing plate 13 to which the slightly adhesive material 12 is applied on the upper surface, to adjust the positions of the manufacturing stage 10 and the reinforcing plate 13. In such a state, the pin members 11 that are protruding from the reinforcing plate 13 are inserted into the through holes 1a of the TAB substrate 20, and the back surface of the TAB substrate 20 is stuck to the slightly adhesive material 12 on the reinforcing plate 13 such that the surface thereof becomes flat, to adjust the positions of the manufacturing stage 10, the reinforcing plate 13 and the TAB substrate 20.

By removing the manufacturing stage 10 by extracting the pin members 11 from the reinforcing plate 13 and the TAB substrate 20, the TAB substrate 20 and the reinforcing plate 13 can be used together in each of the following steps.

(Element Equipping Step)

The manufacturing stage 10 is removed by extracting the pin members 11 from the reinforcing plate 13 and the TAB substrate 20, and the positioned reinforcing plate 13 and the TAB substrate 20 are used to carry out an element equipping step for performing die bonding or wire bonding of the LED element 7 on each electrode region (Cu foil layers 3a and 3b) of the TAB substrate 20, as shown in FIG. 3.

(First and Second Sealing Steps)

Next, the reinforcing plate 13 to which the TAB substrate 20 is stuck on the top surface is used to carry out a first sealing step for sealing the LED element 7 with sealing resin that is mixed with a fluorescent material. Following the first sealing step, a transparent lens forming step as a second sealing step is carried out to form transparent lenses 14 that are described below such that the lens corresponds to a portion above the LED element 7.

In the transparent lens forming step, the lenses 14 are formed by using the reinforcing plate 13 to which the thin and soft TAB substrate 20 is stuck on the top surface.

(Singulation Step)

Figure 7:
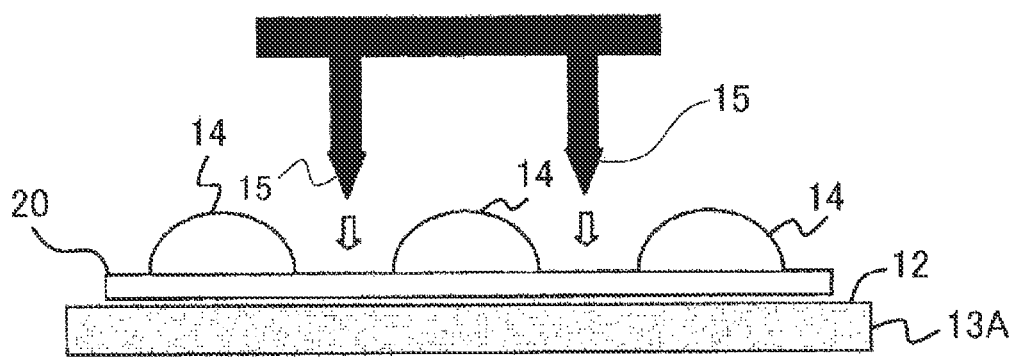
FIG. 7 is a partial side view for explaining a singulation step of a TAB substrate 1 in Embodiment 1 of the present invention.

FIG. 7 is a partial side view for explaining a singulation step of the TAB substrate 20 in Embodiment 1 of the present invention.

In FIG. 7, the TAB substrate 20 is peeled off from the reinforcing plate 13, and then a slightly adhesive tape 13A is stuck to the back surface of the thin and soft TAB substrate 20.

A singulation step for cutting a plurality of LED devices into a predetermined size with a blade mold having a plurality of blade edges 15 is carried out with respect to the TAB substrate 20.

The space between the lenses 14 of each LED device is cut in a predetermined pitch by the blade edges 15 (metal mold). Since the space between the lenses 14 of the LED devices of the TAB substrate 20 is pressed and cut by pushing the blade edges 15 against the space, a slit (cutting allowance) required for cutting the space between the LED devices is "0". In the Embodiment 1, a pressing machine with lens alignment function to which the blade edges 15 (blade mold) are set is used. By using a blade mold to which a plurality of blade edges 15 (shown with 2 blade edges herein) are set, singulation can be practiced more rapidly. In addition, by using a mold to which a plurality of blade molds are set, a plurality of TAB substrates 20 can be simultaneously singulated. Since the positions of the lenses 14 are aligned and the blade edges 15 are entered between the lenses 14 and the cutting allowance is "0", the LED devices including the lenses 14 can be singulated without being damaged. Prior to the pressing by the blade edges 15, the slightly adhesive tape 13A that is stuck to the surface of the thin and soft substrate 20 is prepared, TAB substrate 20 is simultaneously cut in a strip shape, and then the longitudinal direction of the blade edges 15 is rotated 90 degrees to perform simultaneous cutting for singulation. At the time of the singulation, only the TAB substrate 20 is half-cut-off by the blade edges 15 and the slightly adhesive tape 13A is remained. The LED device of the singulated TAB substrate 20 does not get dispersed and is retained in an aligned state due to the slightly adhesive tape 13A.

Since the stress at the time of processing is lower compared to conventional dicing, a slightly adhesive tape having strong adhesion is not required.

Since the positions of the lenses 14 are aligned and the outer shape position is processed by entering the blade edges 15 between the lenses 14 with high precision, damage to the LED device such as a defect of cutting the lenses 14 can be reduced. In addition, since a plurality of LED devices of the TAB substrate 20 are singulated with a plurality of blade edges 15 into a TAB substrate 1 having an individual LED device thereon, the processing time can be shortened. Further, by an optimal setting of an angle of the blade edges 15, processing with substantially 0 slit is realized, and thus the outer shape portion does not get small and the outer shape precision also becomes stable.

According to Embodiment 1 of the present invention described above, the front edge side 3$a$1 in a convex shape in a plan view of the Cu foil layer 3$a$, which is one of the two conductive regions, is disposed to enter into the concave portion (bottom side 3$b$2 side) in a concave shape on a plan view of the Cu foil layer 3$b$, which is the other conductive region.

Thus, since step portions in a plan view (concave-convex portions in a plan view for the prevention of the folding of a device) are provided on opposing sides of the two conductive regions, the folding between wiring patterns can be prevented or suppressed in the thin and soft TAB substrate 1 or 1A. Further, the folding between wiring patterns can also be prevented or suppressed in the TAB substrate 20 (a plurality of TAB substrates 1 or 1A), which is a thin and soft film wiring substrate in which step portions in a plan view (concave-convex portions in a plan view for the prevention of the folding of a device) are provided on opposing sides of the two conductive regions.

Embodiment 2

Embodiment 1 described above explained a case in which opposing sides of two conductive regions corresponding to ±polarity are formed in concave-convex shapes in a plan view to prevent the folding of a device. Embodiment 2 describes a case in which opposing sides of two conductive regions corresponding to ± polarity are formed in L-/L- shapes in a plan view (L- and L-shapes in a plan view).

Figure 8:
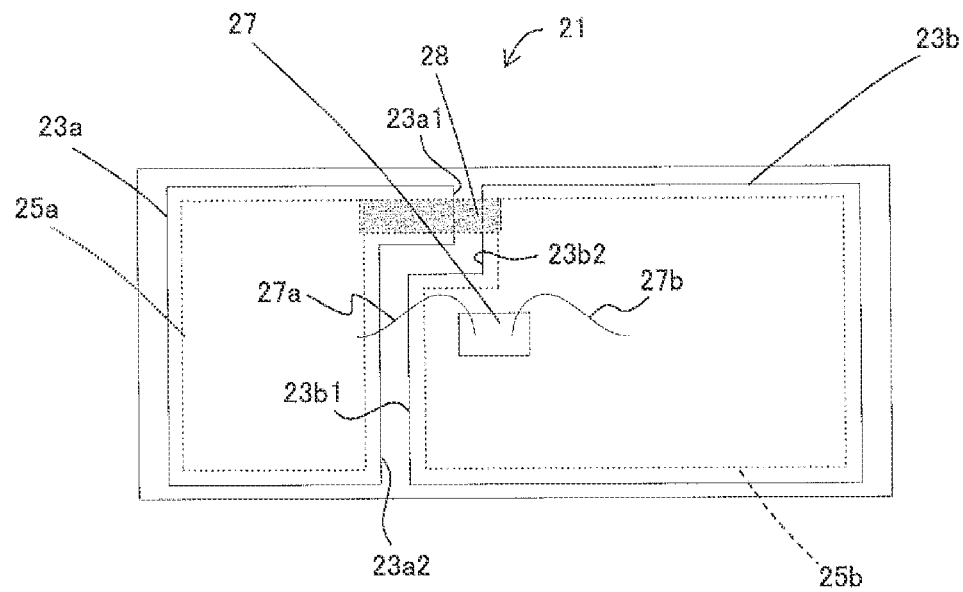
FIG. 8 is a plan view showing a unit configuration example of a TAB substrate in Embodiment 2 of the present invention.
Figure 9:
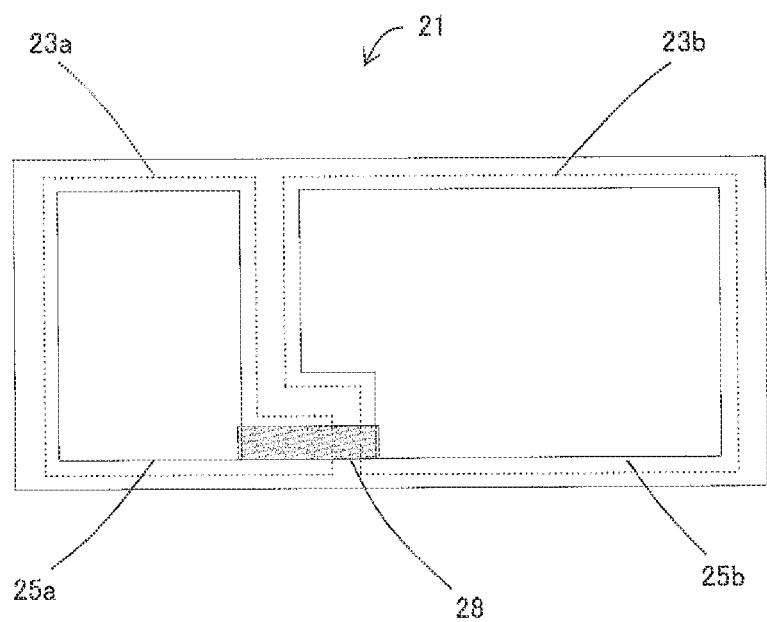
FIG. 9 is a rear view showing a unit configuration example of the TAB substrate in FIG. 8.

FIG. 8 is a plan view showing a unit configuration example of a TAB substrate in Embodiment 2 of the present invention. FIG. 9 is a rear view showing a unit configuration example of the TAB substrate in FIG. 8.

In FIG. 8 and FIG. 9, a TAB substrate 21 as a film wiring substrate (flexible substrate) of Embodiment 2 of the present invention is configured such that Cu foil layers 23$a$ and 23$b$ constituting two conductive regions corresponding to ±polarity are provided on a film base material consisting of a thin and soft polyimide material with an adhesion layer 23$b$ interposed therebetween. Cu posts 25$a$ and 25$b$ functioning as a heat sink are embedded in through holes of the film base material directly under the Cu foil layers 23$a$ and 23$b$. The Cu posts 25$a$ and 25$b$ are electrically connected to the Cu foil layers 23$a$ and 23$b$, respectively. In the top surface of the TAB substrate 21, a white resist 6 or 6A for light reflection is provided (not shown in the figures) on a region other than an LED element 27 equipped region and a region electrically connecting each electrode region of the LED element 27 to the two conductive regions on at least the top surface region of the Cu foil layers 23$a$ and 23$b$, and a region on the adhesion layer on the film base material.

Each of the Cu foil layers 23$a$ and 23$b$, which are left and right electrode regions, are connected by wires from each electrode region of the LED element 27. The LED element 27 is equipped on the Cu foil layer 23$b$ and is fixed with die bond. Further, the wires 27$a$ and 27$b$ from each electrode of the LED element 27 as a semiconductor light emitting element is bonded to the Cu foil layers 23$a$ and 23B as left and right electrode regions, respectively.

A protection element 28 is connected in parallel to the LED element 27. The protection element 28 is provided on a place other than the top surface side of the TAB substrate 21. That is, the protection element 28 is provided on the back surface of the TAB substrate 21 or within the substrate. The protection element 28 is a thin film printed resistance, and thus there is no restriction on the disposition. Thus, since the protection element 28 is a thin film printed resistance that does not have restriction on the disposition, the electrical connection with a thin film metal layer is facilitated, and covering with resin or the like can be easily performed. Thus, shielding and absorption of outgoing light from the LED element 27 is reduced due to the protection element 28. Accordingly, shielding and absorption of light emitted to the outside from the LED element 27 can be suppressed, and outgoing light with good luminance can be obtained without causing reduction in optical output. In addition, formation at a low cost can be realized by using the protection element 28.

The LED element 27 is equipped on the thin and soft TAB substrate 21. However, in order to prevent the folding of the TAB substrate 21 in the middle of a device, opposing sides of the Cu foil layers 23$a$ and 23$b$ as two conductive regions are formed in L- and inverted L-shapes in a plan view.

In the TAB substrate 21, the Cu foil layers 23$a$ and 23$b$, which are conductive layers, are insulated from each other. However, in order to prevent folding or cracking, the patterns thereof in a plan view are formed such that they go into each other in at least L- and L-shapes in a plan view.

In this case, the distance between the Cu foil layers 23$a$ and 23$b$ is about 0.2 mm. In short, a protruding high edge side 23$a$1 of the L-shaped Cu foil layer 23$a$ in a plan view is positioned to enter into the side of a concaved low edge side 23$b$2 of the L-shaped Cu foil layer 23$b$ in a plan view. In addition, a protruding high edge side 23$b$1 of the L-shaped Cu foil layer 23$b$ in a plan view is positioned to enter into the side of a concaved low edge side 23$a$2 of the L-shaped Cu foil layer 23$a$ in a plan view. In this case, the L-shaped Cu foil layers 23$a$ and 23$b$ preferably enter and fit into each other in a deeper level. In order to obtain some effects of preventing folding of a device, at least the high edge side 23$a$1 of the L-shaped Cu foil layer 23$a$ is required to be positioned closer to the side of the low edge side 23$b$2 than the position of the high edge side 23*b*1 of the L-shaped Cu foil layer 23*b*, and the high edge side 23*b*1 is required to be positioned on the side of the low edge side 23*a*2, as shown in FIG. 8. In short, when a straight line is drawn along the high edge side 23*b*1 of the L-shaped Cu foil layer 23*b*, the high edge side 23*a*1 is on the side of the low edge side 23*b*2 of the Cu foil layer 23*b*, and is at least within the L-shape. That is, when a straight line is drawn along the high edge side of one of the L-shapes in a plan view, the high edge side of the L-shape in a plan view of the other conductive region is either on the straight line or is within the side of the low edge side of the other L-shape in a plan view past the straight line, as also described in the above-described Embodiment 1.

In the Embodiment 2, if the depth (the difference between the high edge side 23*b*1 and the low edge side 23*b*2) of the Cu foil layer 23*b* in the L-shape portion is 0.4 mm, the height of the protrusion (the difference between the high edge side 23*a*1 and the low edge side 23*a*2) of the Cu foil layer 23*a* in the L-shape is 0.4 mm, the distance between the Cu foil layers 23*a* and 23*b* is 0.2 mm, and a straight line is drawn along the high edge side 3*b*1 of the L-shaped Cu foil layer 23*b*, the high edge side 23*a*1 is entered into the drawn straight line by 0.2 mm. In short, the high edge side 23*a*1 of the L-shaped Cu foil layer 23*a* and the high edge side 23*b*1 of the L-shaped Cu foil layer 23*b* at least would not align as a straight line, and the high edge side 23*a*1 enters closer to the side of the Cu foil layer 23*b* over the straight line drawn along the high edge side 23*b*1.

In addition, regarding the allowed length of extension of the high edges sides 23*a*1 and 23*b*1 of the L-shaped Cu foil layers 23*a* and 23*b*, electrolytic plating is applied to the top surface of the Cu foil layers 23*a* and 23*b*. Thus, upper and lower LED devices are provided with a power supply portion. Accordingly, the high edge sides 23*a*1 and 23*b*1 of the L-shaped Cu foil layers 23*a* and 23*b* can be extended up to the power supply portion at a maximum. If non-electrolytic plating is applied to the top surface of the Cu foil layers 23*a* and 23*b*, or electrolytic plating is not applied, the high edge sides 23*a*1 and 23*b*1 of the L-shaped Cu foil layers 23*a* and 23*b* can be extended to the opposite side edge portion of the L-shaped Cu foil layers 23*a* and 23*b*, respectively.

According to Embodiment 2 described above, since step portions in a plan view (L-/L-shapes in a plan view) are provided on opposing sides of the two conductive regions, the folding between wiring patterns can be prevented or suppressed in the thin and soft TAB substrate 21. Further, the folding between wiring patterns can also be prevented or suppressed in a thin and soft film wiring substrate (TAB substrate) on which a plurality of TAB substrates 21 are disposed in a matrix state in two dimensions, wherein the opposing sides of two conductive regions on the TAB substrates 21 are provided with step portions in a plan view (L-/L-shapes in a plan view).

Figure 10:
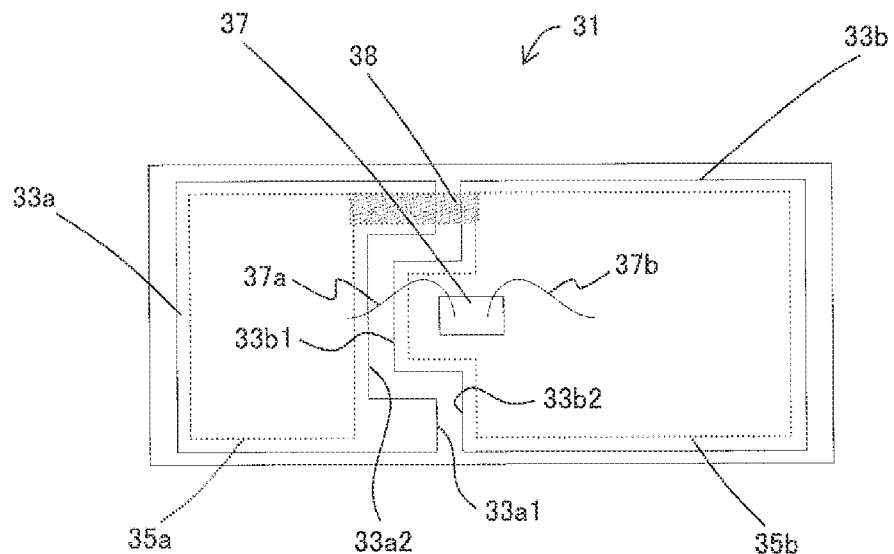
FIG. 10 is a plan view showing another unit configuration example of a TAB substrate in Embodiment 1 of the present invention.

A case in which the Cu foil layers 23*a* and 23*b* are formed such that they go into each other in at least L-/L-shapes in a plan view is described above. However, if the Cu posts 25*a* and 25*b* go into each other in at least L-/L-shapes in a plan view similar to the above description instead of such formation, or in addition to such formation, the folding or cracking of an LED device can be prevented or suppressed. In short, the high edge side of the Cu post 25*a* in an L-shape in a plan view is positioned to enter into an L-shape of the Cu post 25*b* in the L-shape in a plan view. In FIG. 10, the Cu post 25*a* is a rectangular shape, and is not an L-shape.

Further, Embodiment 2 is a configuration where opposing sides of two conductive regions are formed in L-/L-shapes in a plan view, and the protection element 28 is provided in parallel to the LED element 27. However, the present invention is not limited thereto. The configuration in which the protection element 28 is provided in parallel to the LED element 27 can be applied to a configuration where opposing sides of two conductive regions are formed in concave-convex shapes in a plan view as in the above-described Embodiment 1. An example of such a configuration is shown in FIG. 10 and FIG. 11.

FIG. 10 is a plan view showing another unit configuration example of a TAB substrate in Embodiment 1 of the present invention. FIG. 11 is a rear view showing a unit configuration example of the TAB substrate in FIG. 10.

Figure 11:
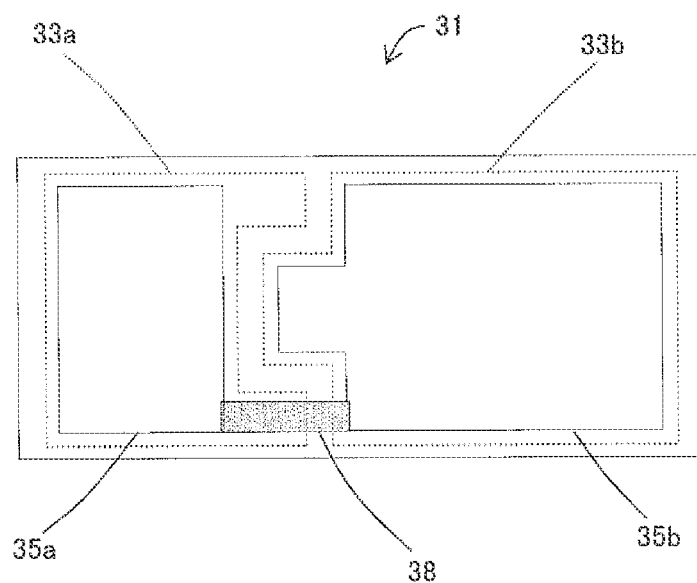
FIG. 11 is a rear view showing a unit configuration example of the TAB substrate in FIG. 10.
Figure 12:
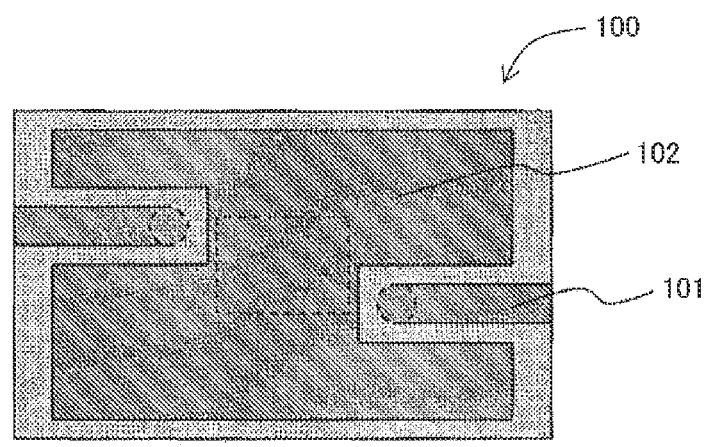
FIG. 12 is a rear view showing a configuration example of the conventional wiring substrate disclosed in Patent Literature 1.
Figure 13:
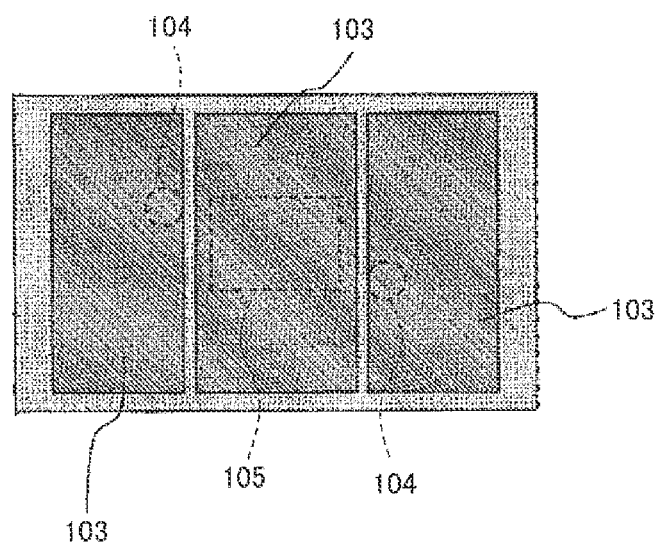
FIG. 13 is a rear view showing another configuration example of the conventional wiring substrate disclosed in Patent Literature 1.
Figure 14:
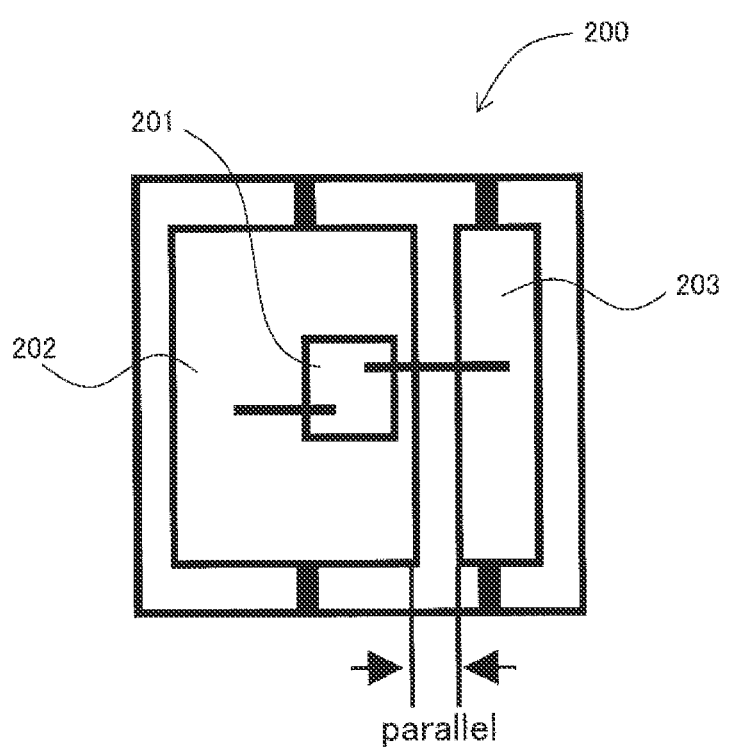
FIG. 14 is a plan view showing yet another configuration example of a conventional film wiring substrate.

In a TAB substrate 31 in FIG. 10 and FIG. 11, the Cu foil layers 33*a* and 33*b*, which are left and right electrode regions, are connected by wires 37*a* and 37*b* from each electrode region of the LED element 37, respectively. The LED element 37 is equipped on the Cu foil layer 33*b* and is fixed with die bond. Further, the wires 37*a* and 37*b* from each electrode of the LED element 37 as a semiconductor light emitting element are bonded to each of the Cu foil layers 33*a* and 33B as left and right electrode regions, respectively.

A protection element 38 is connected in parallel to the LED element 37. The protection element 38 is provided on a place other than the top surface side of the TAB substrate 31. That is, the protection element 38 is provided on the back surface of the TAB substrate 31 or within the substrate. The protection element 38 is similarly a thin film printed resistance as in the case of the protection element 28 described above. Thus, there is no restriction on the disposition.

In the TAB substrate 31, the Cu foil layers 33*a* and 33*b*, which are conductive layers, are insulated from each other. However, in order to prevent folding or cracking, the patterns thereof in a plan view are formed such that they fit into each other in at least surface concave-convex shapes. Such a point is the same as the above-described Embodiment 1.

The distance between the Cu foil layers 33*a* and 33*b* is about 0.2 mm. The front edge side 33*b*1 of the convex-shaped Cu foil layer 33*b* in a plan view is positioned to enter into the concave-shaped Cu foil layer 33*a* in a plan view. In this case, the Cu foil layer 33*a* in a concave shape and the Cu foil layer 33*b* in a convex shape is one portion each, and these can be disposed in a plurality of portions to fit into each other. In this case, the Cu foil layer 33*a* in a concave shape and the Cu foil layer 33*b* in a convex shape preferably enter and fit into each other in a deeper level for the prevention of folding of a device. In order to obtain some effects of preventing the folding of a device, the front edge side 33*b*1 of the Cu foil layer 33*b* in the convex portion is required to be positioned within the Cu foil layer 33*a* in at least the concave portion.

Further, Embodiment 1 of the present invention describes concave-convex shapes in a plan view for the prevention of folding of a device, and Embodiment 2 of the present invention describes L-/L-shapes in a plan view for the prevention of folding of a device. However, the present invention is not limited thereto. Concave-convex shapes in a plan view and L-/L-shapes in a plan view can be used together.

Accordingly, the film wiring substrates 1, 1A, 21 and 31 of the present invention are configured such that the two conductive regions corresponding to ±polarity on the film base material 2 are spaced and insulated from each other while the opposing sides are provided with step portions in a plan view. In short, the step portions are at least either concave-convex shapes in a plan view for the prevention of folding of a device or L-/L-shapes in a plan view for the prevention of folding of a device. Due to such step portions, the present invention is able to achieve the objective of preventing or suppressing the folding between wiring patterns in a thin and soft film wiring substrate. In addition, the space between the two conductive regions, that is, the top surface of the film base material 2 on which the two conductive regions are not formed, is filled with a white resist for light reflection to enable further prevention or suppression of the folding of a device. In addition, the thickness of the white resist (layer) is preferably the same as, or greater than, that of the Cu foil layers.

Further, Embodiments 1 and 2 of the present invention describe a configuration in which only Cu foil layers as two conductive regions corresponding to t polarity are provided on the film base material 2, and the two Cu foil layers are spaced and insulated from each other at a predetermined interval while the opposing sides of the two Cu foil layers are provided with step portions in a plan view. In addition, the Embodiments describe a configuration where the step portions have a rectangular shape regardless of conductive regions being concave-convex shapes in a plan view or L-/L-shapes in a plan view. However, the present invention is not limited thereto. The step portions may be a curved step portions that connect a mountain portion and a valley portion by a curved line. The space between the opposing Cu foil layers is meandering in a curved state.

In addition, as further description of the configuration of the above-described Embodiment 1, concave-convex shapes in a plan view for the prevention of folding of a device is formed by a convex portion and a concave portion in a plan view on opposing sides of a pair of land portions (CU foil layers 3a and 3b) as two conductive regions that fit into each other by spacing a predetermined insulation distance. In addition, as further description of the configuration of the above-described Embodiment 2, L-/L-shapes in a plan view (L- and inverted L-shapes in a plan view) for the prevention of folding of a device is formed by opposing sides of a pair of land portions (CU foil layers 23a and 23b) as two conductive regions that are opposed in an L-shape in a plan view and an inverted L-shape in a plan view to enter into each other spaced by a predetermined insulation distance. The light emitting device of the present invention uses at least either concave-convex shapes in a plan view for the prevention of folding of a device or L-/inverted L-shapes in a plan view for the prevention of folding of a device. For example, concave-convex shapes in a plan view and L-/L-shapes in a plan view (L-/inverted L-shapes in a plan view) may be successively formed to be used together.

The above-described Embodiment 2 is described by using the protection element 28 or 38 (printed resistance) provided on the back surface of an insulating film (film base material 2) as an example. However, the present invention is not limited thereto. Both edge parts of a thin film printed resistance as a protection element may be covered with an anode terminal area and a cathode terminal area that are plated on CU posts 5a and 5b (back surface). In addition, a thin film printed resistance as a printed resistance element may be provided on an adhesion layer (on an adhesion layer directly under the CU foil layers) on the top surface of an insulating film (film base material 2). Further, a thin film printed resistance formed between two insulating films (within the film base material 2) may be used. Thus, by connecting a protection element between an anode terminal area and a cathode terminal area on the CU posts 5a and 5b connected to each CU foil layer of the two conductive regions, the protection element can be connected in parallel to the LED element 7 that is connected to each CU foil layer of the two conductive regions. Accordingly, such a protection element is provided closer to the rear side than a light emitting element (LED element 7) equipped surface, and the protection element is formed in at least one of the top surface side, the back surface side, and the inside of an insulating film (film base material 2).

As described above, the present invention is exemplified by the use of its preferred Embodiments 1 and 2 of the present invention. However, the present invention should not be interpreted solely based on Embodiments 1 and 2. It is understood that the scope of the present invention should be interpreted solely based on the scope of the claims. It is also understood that those skilled in the art can implement equivalent scope of technology, based on the description of the present invention and common knowledge from the description of the detailed preferred Embodiments 1 and 2 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be used in the field of manufacturing methods of a wiring substrate and a film wiring substrate used in LED modules, LED packages or the like. Since step portions in a plan view is provided on opposing sides of two conductive regions, folding between wiring patterns can be prevented or suppressed in a thin and soft film wiring substrate.

The invention claimed is:

1. A film wiring substrate comprising:
   a film base material;
   two conductive regions provided on the film base material and corresponding to ±polarity, wherein either of the two conductive regions define a mounting surface for mounting a light emitting element thereon and the conductive regions are spaced and insulated from each other; and
   conductive post layers going though the film base material and electrically connected to the two conductive regions respectively;
   wherein first end surfaces of the conductive post layers opposite to second end surfaces of the conductive post layers facing the conductive regions are exposed; and
   wherein the exposed first end surfaces of the conductive post layers is smaller than the conductive regions in area.

2. The film wiring substrate of claim 1, wherein step portions in a plan view are provided on opposing sides of the two conductive regions.

3. The film wiring substrate of claim 2, wherein the step portions comprise at least either:
   concave-convex shapes in a plan view for preventing folding of a device; or
   L-shapes in a plan view for preventing folding of a device.

4. The film wiring substrate of claim 2, wherein the concave-convex shapes in a plan view are configured such that opposing sides of the two conductive regions fit into each other spaced by a predetermined distance.

5. The film wiring substrate of claim 4, wherein a front edge side of a convex shape in a plan view of one of the two conductive regions is disposed to enter into a concave portion of a concave shape in a plan view of the other conductive region.

6. The film wiring substrate according to claim 2, wherein a plurality of the two conductive regions are allocated in a matrix state for each light emitting device.

7. The film wiring substrate according to claim 2, wherein a white resist for light reflection is formed on the top surface portion on which the two conductive regions are not formed and a portion of the top surface portion of the two conductive regions.

8. A light emitting device, wherein the light emitting device is equipped with a light emitting element on either of the two conductive regions of the film wiring substrate of claim 2, and sealing with resin including at least a fluorescent material is performed while both electrodes of the light emitting element and the two conductive regions are electrically connected.

9. A film wiring substrate comprising:
a film base material;
two conductive regions provided on the film base material and corresponding to ±polarity, wherein either of the two conductive regions define a mounting surface for mounting a light emitting element thereon and the conductive regions are spaced and insulated from each other; and
conductive post layers going though the film base material and electrically connected to the two conductive regions respectively;
wherein first end surfaces of the conductive post layers opposite to second end surfaces of the conductive post layers facing the conductive regions are exposed;
wherein one of the two conductive regions has a single rectangular portion and a convex portion protruding from the single rectangular portion and has a convex shape in a plan view;
wherein the other of the two conductive regions has a single rectangular portion and a concave portion recessing into the single rectangular portion and has a concave shape in a plan view;
wherein the concave and convex shapes in a plan view are configured such that opposing sides of the two conductive regions fit into each other spaced by a predetermined distance; and
wherein a front edge side of the convex shape in a plan view of the one of the two conductive regions is disposed to enter into the concave portion of the concave shape in a plan view.

10. The film wiring substrate of claim 9, wherein step portions in a plan view are provided on opposing sides of the two conductive regions.

11. The film wiring substrate of claim 10, wherein the step portions comprise at least either:
concave-convex shapes in a plan view for preventing folding of a device; or
L-shapes in a plan view for preventing folding of a device.

12. The film wiring substrate of claim 10, wherein the concave-convex shapes in a plan view are configured such that opposing sides of the two conductive regions fit into each other spaced by a predetermined distance.

13. The film wiring substrate of claim 12, wherein a front edge side of a convex shape in a plan view of one of the two conductive regions is disposed to enter into a concave portion of a concave shape in a plan view of the other conductive region.

14. The film wiring substrate according to claim 10, wherein a plurality of the two conductive regions are allocated in a matrix state for each light emitting device.

15. The film wiring substrate according to claim 10, wherein a white resist for light reflection is formed on the top surface portion on which the two conductive regions are not formed and a portion of the top surface portion of the two conductive regions.

16. A light emitting device, wherein the light emitting device is equipped with a light emitting element on either of the two conductive regions of the film wiring substrate of claim 10, and sealing with resin including at least a fluorescent material is performed while both electrodes of the light emitting element and the two conductive regions are electrically connected.

* * * * *